(12) United States Patent
Lee

(10) Patent No.: US 8,487,428 B2
(45) Date of Patent: Jul. 16, 2013

(54) METHOD AND SYSTEM FOR PROVIDING A RELIABLE SEMICONDUCTOR ASSEMBLY

(75) Inventor: Michael G. Lee, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 499 days.

(21) Appl. No.: 11/942,794

(22) Filed: Nov. 20, 2007

(65) Prior Publication Data

US 2009/0127704 A1 May 21, 2009

(51) Int. Cl.
*H01L 23/488* (2006.01)
*H01L 21/60* (2006.01)

(52) U.S. Cl.
USPC .......... 257/723; 257/618; 257/678; 257/684; 257/701; 438/106; 438/107; 438/108; 438/109; 174/545; 174/560; 174/561; 174/563

(58) Field of Classification Search
USPC ....................................................... 257/777
See application file for complete search history.

(56) References Cited

U.S. PATENT DOCUMENTS

| | | | | |
|---|---|---|---|---|
| 4,878,611 A * | 11/1989 | LoVasco et al. | ......... | 228/180.22 |
| 5,056,215 A * | 10/1991 | Blanton | ........... | 29/840 |
| 5,220,200 A * | 6/1993 | Blanton | ........... | 257/778 |
| 5,299,939 A * | 4/1994 | Walker et al. | ........... | 439/74 |
| 5,329,423 A * | 7/1994 | Scholz | ........... | 361/760 |
| 5,337,219 A * | 8/1994 | Carr et al. | ........... | 361/794 |
| 5,396,687 A * | 3/1995 | Osterman | ........... | 24/449 |
| 5,477,086 A * | 12/1995 | Rostoker et al. | ........... | 257/737 |
| 5,523,628 A * | 6/1996 | Williams et al. | ........... | 257/777 |
| 5,558,271 A * | 9/1996 | Rostoker et al. | ........ | 228/180.22 |
| 5,597,469 A * | 1/1997 | Carey et al. | ........... | 205/118 |
| 5,611,122 A * | 3/1997 | Torigoe et al. | ........... | 24/442 |
| 5,671,511 A * | 9/1997 | Hattori et al. | ........... | 24/444 |
| 5,712,190 A * | 1/1998 | Bertin et al. | ........... | 438/5 |
| 5,813,095 A * | 9/1998 | Robertson | ........... | 24/442 |
| 5,889,657 A * | 3/1999 | Kono | ........... | 361/773 |
| 5,897,335 A * | 4/1999 | Wyland et al. | ........... | 438/108 |
| 5,903,059 A * | 5/1999 | Bertin et al. | ........... | 257/785 |

(Continued)

FOREIGN PATENT DOCUMENTS

| | | |
|---|---|---|
| JP | 10335527 | 12/1998 |
| JP | 200509.780 | 4/2005 |
| JP | 2005093780 | 4/2005 |

OTHER PUBLICATIONS

Optical lithography: Introduction by G.L. -T. Chiu and J.M. Shaw; IBM J. Res. Develop. vol. 41, No. 1/2; 4 pages, Jan./Mar. 1997.

(Continued)

*Primary Examiner* — Matthew W Such
*Assistant Examiner* — William Harriston
(74) *Attorney, Agent, or Firm* — Baker Botts L.L.P.

(57) ABSTRACT

A semiconductor assembly is provided that includes a substrate. A first set of non-conductive hedges is disposed on and protrudes from a first surface of the substrate. A chip is coupled to and spaced apart from the substrate. The chip has a second surface facing the first surface of the substrate. A second set of non-conductive hedges is disposed on and protrudes from the second surface of the chip. The first set of hedges is configured and positioned to engage the second set of hedges to restrict movement of the substrate with respect to the chip. The second set of hedges is configured and positioned to engage the first set of hedges to restrict movement of the chip with respect to the substrate.

22 Claims, 6 Drawing Sheets

U.S. PATENT DOCUMENTS

| | | | |
|---|---|---|---|
| 5,904,581 A * | 5/1999 | Pope et al. | 439/74 |
| 5,940,679 A * | 8/1999 | Tomura et al. | 438/15 |
| 5,956,575 A * | 9/1999 | Bertin et al. | 438/110 |
| 5,968,670 A * | 10/1999 | Brofman et al. | 428/576 |
| 6,046,910 A * | 4/2000 | Ghaem et al. | 361/760 |
| 6,124,631 A * | 9/2000 | Cardot et al. | 257/667 |
| 6,208,024 B1 * | 3/2001 | DiStefano | 257/696 |
| 6,229,209 B1 * | 5/2001 | Nakamura et al. | 257/737 |
| 6,255,586 B1 * | 7/2001 | Kim et al. | 174/538 |
| 6,281,105 B1 * | 8/2001 | Cotte et al. | 438/612 |
| 6,287,126 B1 * | 9/2001 | Berger et al. | 439/66 |
| 6,294,040 B1 * | 9/2001 | Raab et al. | 156/249 |
| 6,297,560 B1 * | 10/2001 | Capote et al. | 257/778 |
| 6,365,842 B1 * | 4/2002 | Jiang | 174/261 |
| 6,391,251 B1 * | 5/2002 | Keicher et al. | 419/7 |
| 6,392,144 B1 * | 5/2002 | Filter et al. | 174/535 |
| 6,406,636 B1 * | 6/2002 | Vaganov | 216/2 |
| 6,410,861 B1 * | 6/2002 | Huang et al. | 174/260 |
| 6,426,880 B1 * | 7/2002 | Chen | 361/773 |
| 6,485,843 B1 * | 11/2002 | Eslamy | 428/548 |
| 6,525,413 B1 * | 2/2003 | Cloud et al. | 257/686 |
| 6,624,512 B2 * | 9/2003 | Kurusu | 257/737 |
| 6,638,638 B2 * | 10/2003 | Kim et al. | 428/546 |
| 6,658,731 B1 * | 12/2003 | Goenka et al. | 29/846 |
| 6,674,647 B2 * | 1/2004 | Pierson et al. | 361/760 |
| 6,683,387 B1 * | 1/2004 | Brownfield | 257/786 |
| 6,709,895 B1 * | 3/2004 | Distefano | 438/115 |
| 6,733,681 B1 * | 5/2004 | Hipwell, Jr. et al. | 216/2 |
| 6,740,578 B2 * | 5/2004 | Akram | 438/614 |
| 6,756,540 B2 * | 6/2004 | Hedler et al. | 174/539 |
| 6,798,030 B1 * | 9/2004 | Izumi et al. | 257/428 |
| 6,830,463 B2 * | 12/2004 | Keller | 439/71 |
| 6,881,074 B1 * | 4/2005 | McLenaghan | 439/70 |
| 6,946,745 B2 * | 9/2005 | Hesse | 257/783 |
| 7,013,538 B2 * | 3/2006 | Browne et al. | 24/603 |
| 7,018,867 B2 * | 3/2006 | Gracias | 438/110 |
| 7,092,603 B2 * | 8/2006 | Glebov et al. | 385/51 |
| 7,169,693 B2 * | 1/2007 | Akram et al. | 438/612 |
| 7,213,330 B2 * | 5/2007 | Caldwell et al. | 29/832 |
| 7,253,078 B1 * | 8/2007 | Nguyen et al. | 438/411 |
| 7,308,738 B2 * | 12/2007 | Barvosa-Carter et al. | 24/442 |
| 7,310,457 B2 * | 12/2007 | Kotake | 385/14 |
| 7,436,114 B2 * | 10/2008 | Wang et al. | 313/504 |
| 7,479,402 B2 * | 1/2009 | Yu | 438/50 |
| 7,550,365 B2 * | 6/2009 | Emery et al. | 438/455 |
| 7,557,452 B1 * | 7/2009 | Williams et al. | 257/778 |
| 7,781,867 B2 * | 8/2010 | Lee | 257/618 |
| 7,872,332 B2 * | 1/2011 | Fay et al. | 257/621 |
| 2001/0002330 A1 * | 5/2001 | Benenati et al. | 438/613 |
| 2001/0053565 A1 * | 12/2001 | Khoury | 438/121 |
| 2001/0055447 A1 * | 12/2001 | Delprat et al. | 385/50 |
| 2003/0210531 A1 * | 11/2003 | Alcoe et al. | 361/728 |
| 2004/0028875 A1 * | 2/2004 | Van Rijn et al. | 428/98 |
| 2004/0157360 A1 * | 8/2004 | Gracias | 438/106 |
| 2005/0012212 A1 * | 1/2005 | Gilleo | 257/737 |
| 2005/0189568 A1 * | 9/2005 | Colgan et al. | 257/202 |
| 2005/0207693 A1 * | 9/2005 | Yokouchi | 385/14 |
| 2006/0209519 A1 * | 9/2006 | Bakir et al. | 361/772 |
| 2007/0045812 A1 * | 3/2007 | Heng | 257/693 |
| 2007/0148817 A1 * | 6/2007 | Williams et al. | 438/106 |
| 2007/0148818 A1 * | 6/2007 | Williams et al. | 438/106 |
| 2008/0142943 A1 * | 6/2008 | Kim et al. | 257/686 |

OTHER PUBLICATIONS

Flip Chips Dot Com; Tutorial 1—Oct. 2000; Introduction to Flip Chip: What, Why, How; George A. Riley, FlipChips.com; http://www.flipchips.com/tutorial01.html; 7 pages.

Flip Chips Dot Com; Tutorial 2—Nov. 2000; Solder Bump Flip Chip; http://www.flipchips.com/tutorial02a.html; 10 pages.

Chinese Office Action with English Translation; Application No. 2008-296095; pp. 4, Nov. 29, 2011.

Japanese Office Action with English Translation; Application No. 2008-296095; pp. 5 mailing date: Jun. 12, 2012.

* cited by examiner

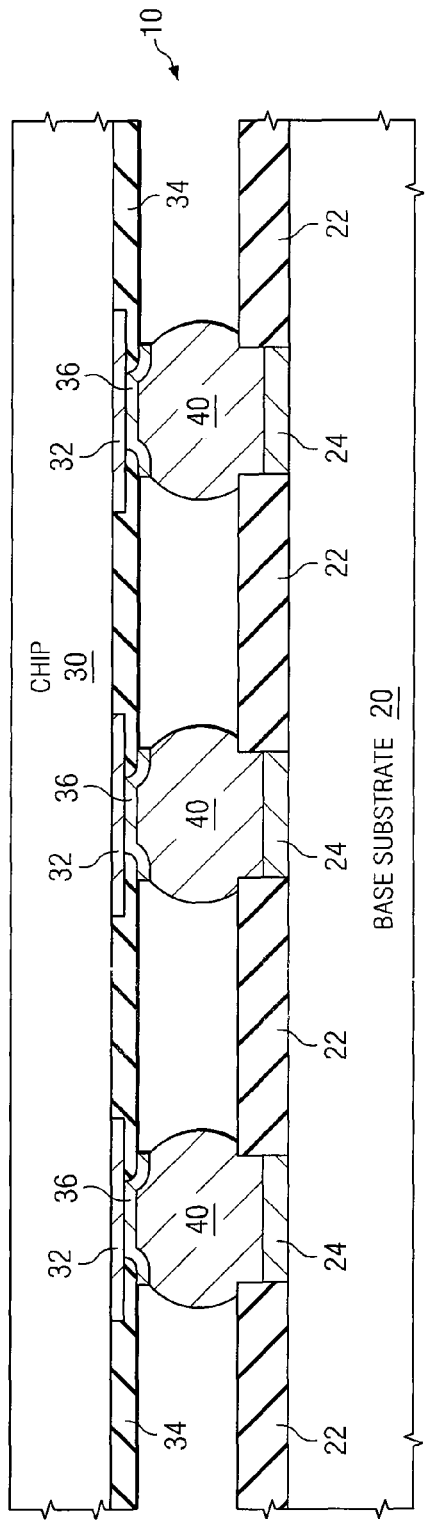
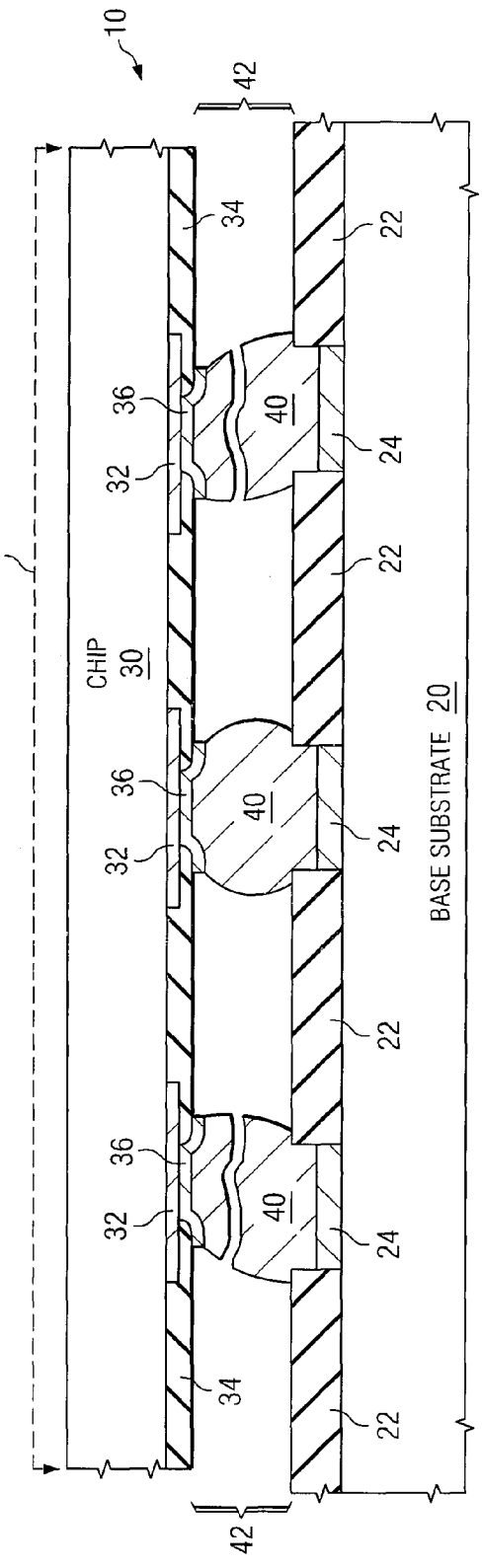
FIG. 1A
FIG. 1B

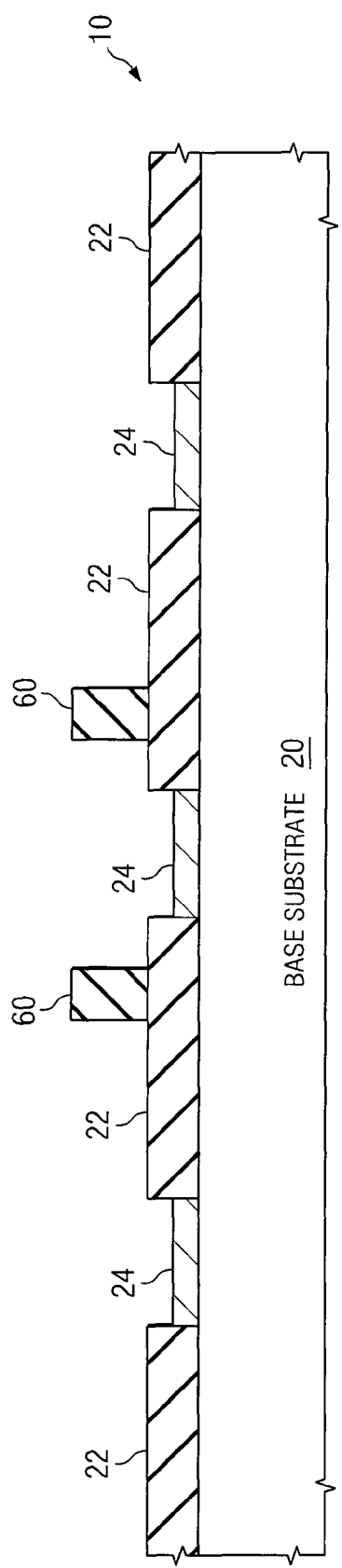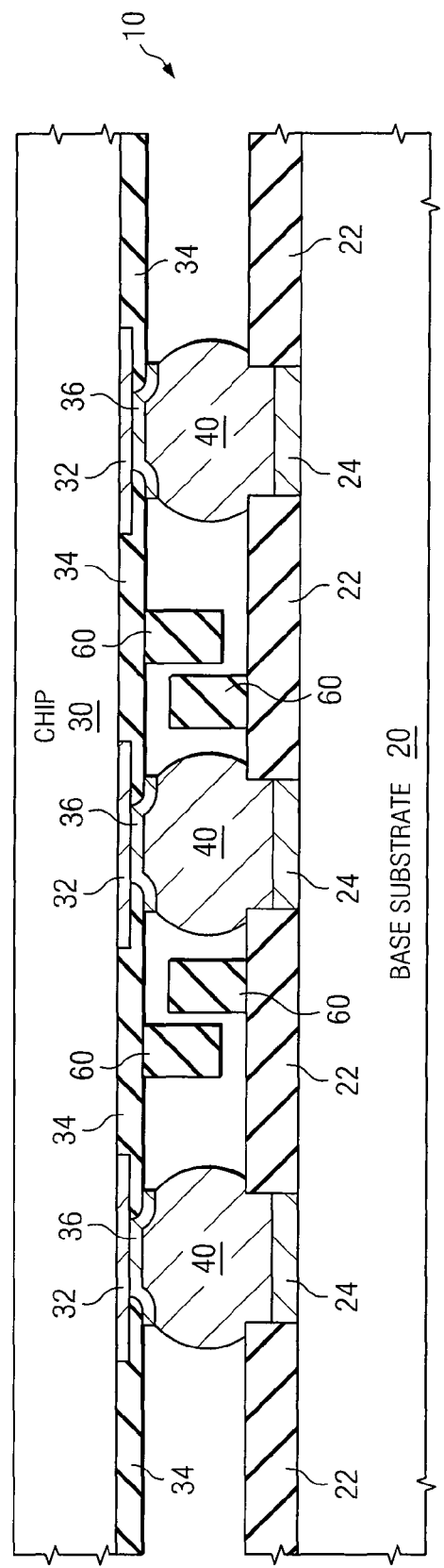

METHOD AND SYSTEM FOR PROVIDING A RELIABLE SEMICONDUCTOR ASSEMBLY

TECHNICAL FIELD

This invention relates generally to semiconductors and, more particularly, to a method and system for providing a reliable semiconductor assembly.

BACKGROUND

Low-profile semiconductor assemblies are in high demand. In response to the high demand, semiconductor assemblies have been developed that include chips coupled to substrates using low-profile interconnections. For example, the low-profile interconnections may comprise solder bumps that provide an electric path between the chip and the substrate.

However, the solder bumps may suffer from stress caused by relative movement between the chip and substrate. As a result, the solder bumps and assembly may suffer from reliability problems. For example, the substrate and the chip may have a different coefficient of thermal expansion (CTE). The stress caused by the coefficient of thermal expansion mismatch may cause cracking to the solder bumps. A material referred to as underfill may be applied between the chip and the substrate to reinforce the mechanical strength of the assembly. As the profile height decreases, however, it becomes more difficult to apply underfill material between the chip and the substrate.

SUMMARY OF THE DISCLOSURE

The present invention provides a method and system for providing a reliable semiconductor assembly that substantially eliminates or reduces at least some of the disadvantages and problems associated with previous methods and systems.

According to one embodiment of the present invention, a semiconductor assembly is provided that includes a substrate. A first set of one or more non-conductive hedges is disposed on and protrudes from a first surface of the substrate. A chip is coupled to and spaced apart from the substrate. The chip has a second surface facing the first surface of the substrate. A second set of one or more non-conductive hedges is disposed on and protrudes from the second surface of the chip. The first set of one or more hedges is configured and positioned to engage the second set of one or more hedges to restrict movement of the substrate with respect to the chip. The second set of one or more hedges is configured and positioned to engage the first set of one or more hedges to restrict movement of the chip with respect to the substrate.

Certain embodiments of the invention may provide one or more technical advantages. A technical advantage of one embodiment may include hedges that restrict movement caused by, for example, the differences in the coefficients of thermal expansion (CTE) of the chip and substrate. Thus, reliable solder bumps with a low profile may be applied without requiring underfill to reinforce the solder bumps.

Another technical advantage of one embodiment may include an adhesive that is applied to the hedges on the substrate to bond those hedges to the hedges on the chip. In this embodiment, bonded hedges may restrict not only lateral movement but also vertical movement.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1A is a diagram illustrating an example semiconductor assembly;

FIG. 1B is a diagram illustrating an example of the results of stress to the semiconductor assembly of FIG. 1A;

FIG. 2B is a diagram illustrating an example base substrate with hedges disposed on the surface of the base substrate, in accordance with one embodiment of the present invention;

FIG. 3A is a diagram illustrating the chip of FIG. 2A coupled with the base substrate of FIG. 2B, in accordance with one embodiment of the present invention;

DETAILED DESCRIPTION OF THE DRAWINGS

Embodiments of the present invention and its advantages are best understood by referring to FIGS. 1-6 of the drawings, like numerals being used for like and corresponding parts of the various drawings.

FIG. 1A is a diagram illustrating an example semiconductor assembly 10. Semiconductor assemblies, such as assembly 10, are devices in which one or more semiconductor chips (e.g., integrated circuits) are coupled to a base substrate. The base substrate may be used to couple a chip to other components on or external to the substrate. Typically, to couple the chip to the substrate, solder bumps are applied to the surface of the chip. The chip and the applied solder bumps are aligned over the base substrate, such that each solder bump at least partially fills a bump pad on the base substrate, and such that the chip is spaced apart from the base substrate. During movement, caused by thermal expansion or contraction for example, the stress caused by the movement may cause reliability problems for the aforementioned solder bumps and assembly. As described in more detail below in conjunction with the subsequent figures, a set of one or more hedges may be disposed on the chip and/or on the base substrate to engage each other to restrict movement. Restricting movement may include preventing or reducing movement, such as upon thermal expansion or contraction. This helps to reduce the amount of stress at the solder bumps and improves the reliability of the solder bumps and assembly.

Figure 1C:
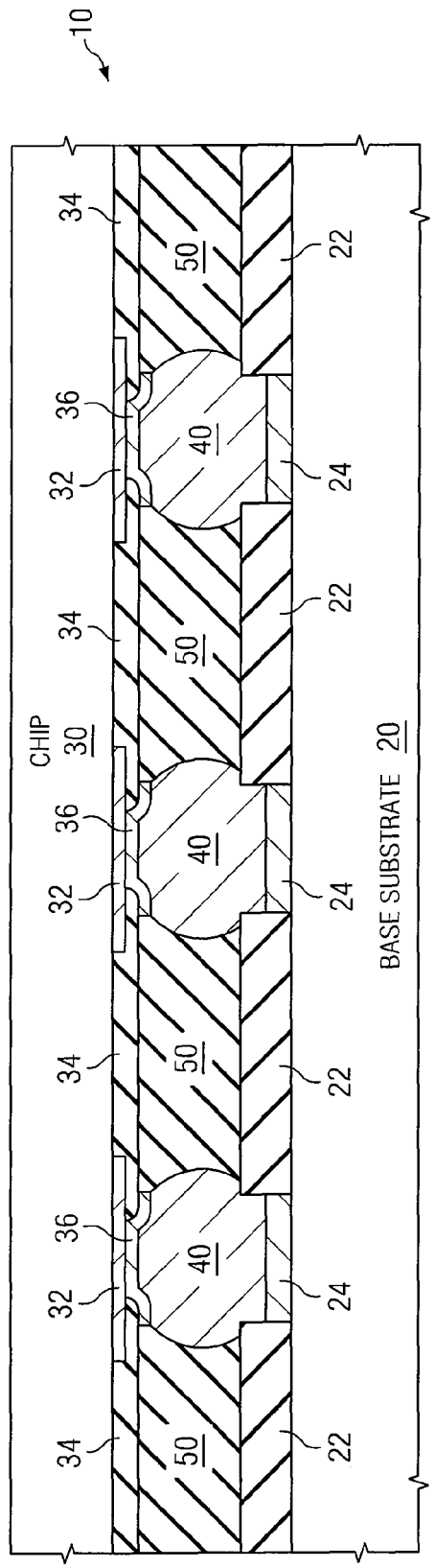
FIG. 1C is a diagram illustrating an underfill material applied to the semiconductor assembly of FIG. 1A.

As shown in FIG. 1A, assembly 10 includes a base substrate 20 and a chip 30. Base substrate 20 is coupled to chip 30 by one or more solder bumps 40. It should be noted that although selected components of assembly 10 are illustrated in FIGS. 1A-1C at a high level, other materials and coupling techniques might be used. Moreover, assembly 10 may include any other well-known components and the techniques described herein may be applied to many varieties of semiconductor assemblies such as chip on chip, chip on substrate, electro-optic component on chip, and micro-electromechanical systems (MEMS) on chip, for example.

Base substrate 20 may comprise any suitable surface and may comprise any suitable ceramic or organic material. For example, base substrate 20 may comprise a plastic surface mount for chip 30 (also referred to as a package). As another example, base substrate 20 may comprise a second semiconductor chip that also acts as a base substrate for chip 30. In the illustrated embodiment, base substrate 20 includes a solder mask 22 that defines an opening for bump pads 24. Bump pads 24 connect to circuitry within base substrate 20 that allows base substrate 20 to electrically (or otherwise) couple chip 30 with an external device or with one or more other components coupled to base substrate 20. Solder mask 22 may comprise any suitable non-conductive material such as polymer, for example. Bump pads 24 may comprise any suitable conductive material such as copper, for example.

Chip 30 may comprise any suitable device operable to perform data transmission. For example, chip 30 may perform data transmission using electric signals. Chip 30 may refer to a silicon chip, microelectronic chip, optoelectronic chip, MEMS chip, microchip die, integrated circuit, or any other suitable data transmission device. Chip 30 may be coupled to base substrate 20 by any suitable technique, such as by flip-chip coupling, for example.

Chip 30 includes contact pads 32 that provide input/output (I/O) to chip 30. Contact pads 32 may comprise any suitable conductive material such as copper, for example. Chip 30 may also includes a passivation layer 34 that provides a contamination protection layer for chip 30. Passivation layer 34 may comprise any suitable layer of material such as dielectric material, for example. Chip 30 may further include under bump metallurgy (UBM) layers 36 that assist in coupling chip 30 to solder bumps 40. UBM layer 36 may comprise any suitable conductive material such as nickel, for example.

Solder bumps 40 may comprise any suitable material operable to interconnect chip 30 and substrate 20. According to various embodiments, solder bumps 40 may comprise any suitable conductive material such as gold, tin, lead, or copper, for example. According to other embodiments, solder bumps 40 may be replaced by other types of interconnections such as microelectronic interconnections, optical interconnections, or any other suitable interconnections. As described in more detail below, solder bumps 40 may suffer from stress reducing the reliability of solder bumps 40 and assembly 10.

FIG. 1B is a diagram illustrating an example of the results of stress to semiconductor assembly 10 of FIG. 1A. Assembly 10 may suffer from stress caused by relative movement between chip 30 and base substrate 20. As a result, solder bumps 40 may suffer from cracks, as shown in FIG. 1B. For example, chip 30 may contract and move with respect to base substrate 20, as indicated by reference number 44 in FIG. 1B, thereby causing stress to solder bumps 40, as indicated by reference number 42 in FIG. 1B.

FIG. 1C is a diagram illustrating an underfill material 50 applied to semiconductor assembly 10 of FIG. 1A. Underfill 50 may be applied between the chip and the base substrate 20 to reinforce the mechanical strength of solder bumps 40. Underfill 50 may comprise a flux material mixed with any suitable organic material, such as an epoxy, for example.

However, it may be difficult to introduce underfill 50 in the space between chip 30 and base substrate 20 because the space may be too narrow and the composition of underfill 50 may have a high viscosity. Yet a narrow space between chip 30 and base substrate 20 is highly desirable in order to achieve short wiring lengths and high interconnect densities in assembly 10.

Particular embodiments of the present invention provide "hedges" to increase the structural integrity of assembly 10 and thereby improve the reliability of solder bumps 40 and assembly 10 without requiring underfill 50. For example, the hedges may comprise a set of one or more non-conductive protrusions disposed on chip 30 and base substrate 20. The hedges on chip 30 are configured and positioned to engage the hedges on base substrate 20 to restrict movement of chip 30 with respect to base substrate 20. In addition, the hedges on base substrate 20 are configured and positioned to engage the hedges on chip 30 to restrict movement of base substrate 20 with respect to chip 30. A better understanding of the particular embodiments of the present invention is provided below with reference to FIGS. 2A and 2B.

Figure 2A:
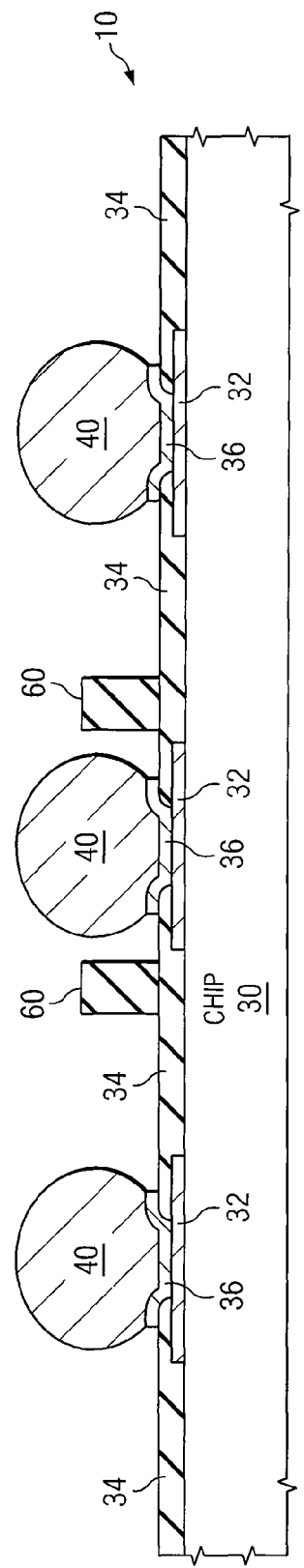
FIG. 2A is a diagram illustrating an example chip with hedges disposed on the surface of the chip, in accordance with one embodiment of the present invention.

FIGS. 2A and 2B are diagrams illustrating hedges 60 disposed on the surface of chip 30 and base substrate 20, respectively, in accordance with one embodiment of the present invention. According to the embodiment, hedges 60 may comprise non-conductive protrusions disposed substantially perpendicular to chip 30 and base substrate 20.

According to one embodiment of the present invention, hedges 60 may comprise a deformable material such as a photo-epoxy or polysiloxane based material, for example. Moreover, although the illustrated embodiments show hedges 60 with a rectangular shape, hedges 60 may have any suitable shape, such as a rounded, square, triangular, or multi-angular shape. Indeed, the present disclosure contemplates many different shapes and compositions of hedges 60. Various embodiments may include, some, all, or none of the enumerated shapes and compositions.

According to one embodiment of the invention, hedges 60 may be formed by photolithography. For example, a resist material may be deposited on top of solder mask 22 and passivation layer 34, respectively, such that solder mask 22 and passivation layer 34 are completely covered. The resist material is then etched to leave protrusions formed on the surface of chip 30 and base substrate 20 that comprise hedges 60.

According to another embodiment, hedges 60 may be disposed on a surface of chip 30 and base substrate 20 by bonding each hedge 60 to the surface with an epoxy, solder, or any other similar material. However, the present disclosure contemplates many types of techniques for disposing hedges 60 on chip 30 and base substrate 20. Various embodiments may include, some, all, or none of the enumerated techniques.

FIG. 3A is a diagram illustrating chip 30 of FIG. 2A coupled with base substrate 20 of FIG. 2B, in accordance with one embodiment of the present invention. In the illustrated embodiment, solder bumps 40 applied to chip 30 are positioned over base substrate 20, such that each solder bump 40 is aligned with a corresponding bump pad 24 on the surface of base substrate 20, and such that chip 30 is spaced apart from base substrate 20. With solder bumps 40 disposed between, and in contact with the chip 30 and bump pads 24, a rigid coupling may be formed between a surface of chip 30 and a facing surface of base substrate 20.

In the illustrated embodiment, hedges 60 on the surfaces of chip 30 and base substrate 20 increase the structural integrity of the rigid coupling between chip 30 and base substrate 20. For example, hedges 60 on chip 30 are configured and positioned to engage hedges 60 on base substrate 20 to restrict movement of chip 30 with respect to base substrate 20. In addition, hedges 60 on base substrate 20 are configured and positioned to engage hedges 60 on chip 30 to restrict movement of base substrate 20 with respect to chip 30.

According to one embodiment of the present invention, hedges 60 on chip 30 are disposed such that they are positioned substantially in contact with hedges 60 on base substrate 20. In another embodiment, hedges 60 on chip 30 are disposed such that they are positioned substantially near hedges 60 on base substrate 20 according to an expectation of movement upon, for example, thermal expansion or contraction. Thus, in general, hedges 60 are disposed in order to engage each other to prevent or restrict lateral movement between chip 30 and base substrate 20, as further described below with reference to FIG. 3B.

Figure 3B:
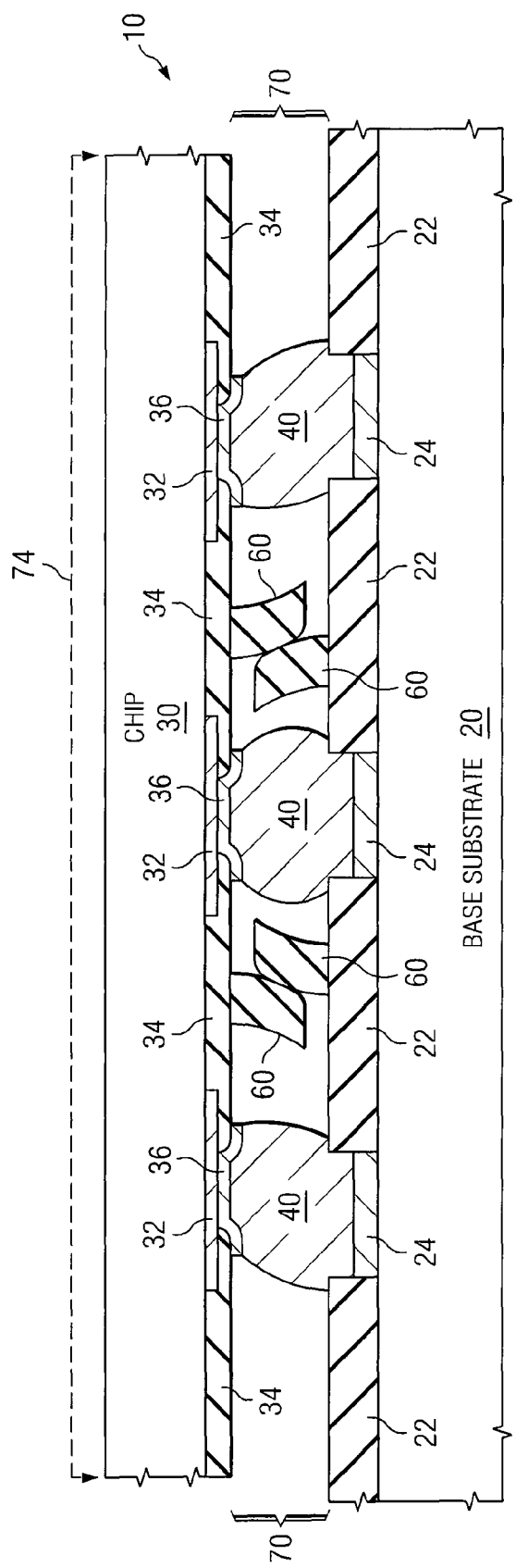
FIG. 3B is a diagram illustrating hedges reducing the movement of the chip of FIG. 2A with respect to the base substrate of FIG. 2B, in accordance with one embodiment of the present invention.

FIG. 3B is a diagram illustrating hedges 60 reducing the movement of chip 30 of FIG. 2A with respect to base substrate 20 of FIG. 2B, in accordance with one embodiment of the present invention. In the illustrated embodiment, chip 30 is contracting causing movement with respect to base substrate 20, as indicated by reference number 74, and may cause stress to solder bumps 40, as indicated by reference number 70. As shown in FIG. 3B, when movement occurs, hedges 60 on chip 30 engage hedges 60 on base substrate 20. According to one embodiment of the invention, hedges 60 may be deformable and may deform when engaged, thereby reducing the movement and, therefore, the stress on solder bumps 40. It should be noted that the deformation illustrated in FIG. 3B may be exaggerated to aid in illustration. In other embodiments, hedges 60 may not deform. Thus, low-profile solder bumps 40 may be applied in assembly 10 without requiring underfill to reinforce solder bumps 40.

Figure 4A:
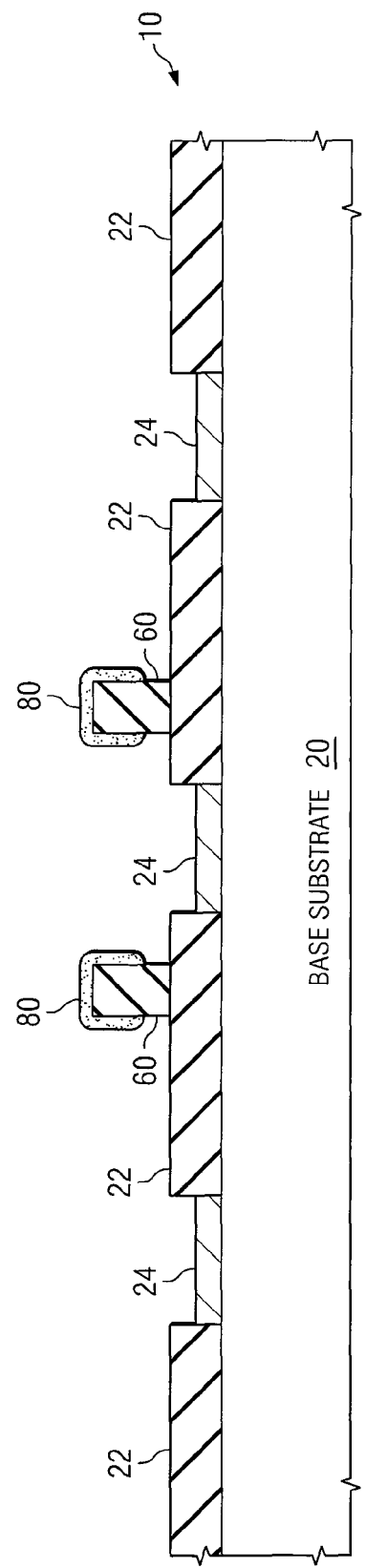
FIG. 4A is a diagram illustrating an adhesive applied to hedges disposed on the surface of the base substrate of FIG. 2B, in accordance with one embodiment of the present invention.

FIG. 4A is a diagram illustrating an adhesive 80 applied to hedges 60 disposed on the surface of base substrate 20 of FIG. 2B, in accordance with one embodiment of the present invention. Adhesive 80 may comprise an epoxy or any other suitable bonding material. According to one embodiment of the invention, adhesive 80 is applied to hedges 60 by partially immersing hedges 60 in an adhesive dip; however any other suitable techniques may be used. In the illustrated embodiment, an adhesive 80 is applied on hedges 60 so that the hedges 60 on chip 30 are bonded to hedges 60 on base substrate 20 as shown in FIG. 4B.

Figure 4B:
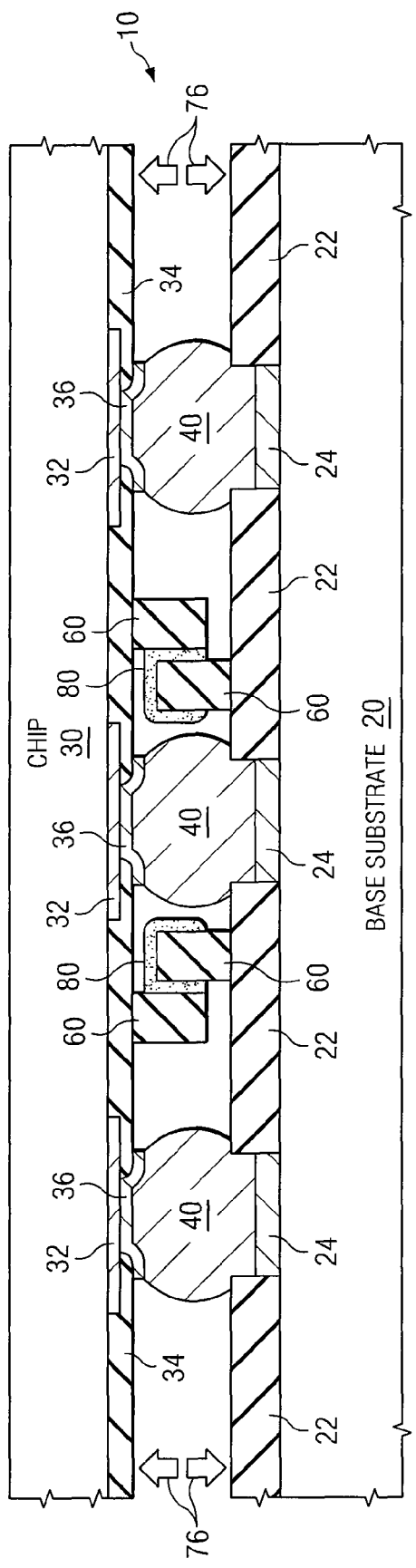
FIG. 4B is a diagram illustrating bonded hedges reducing the vertical movement of the chip of FIG. 2A with respect to the base substrate of FIG. 2B, in accordance with one embodiment of the present invention.

FIG. 4B is a diagram illustrating bonded hedges 60 reducing the vertical movement of chip 30 of FIG. 2A with respect to base substrate 20 of FIG. 2B, in accordance with one embodiment of the present invention. In the illustrated embodiment, chip 30 may contract causing movement with respect to base substrate 20, and may cause stress to solder bumps 40, as indicated by reference number 76. According to the embodiment, adhesive 80 bonds hedges 60 on chip 30 and hedges 60 on base substrate 20 to prevent or restrict vertical movement of chip 30 with respect to base substrate 20, thereby reducing stress on solder bumps 40. As noted above, hedges 60 may also engage each other to prevent or restrict lateral movement between chip 30 and base substrate 20.

Figure 4C:
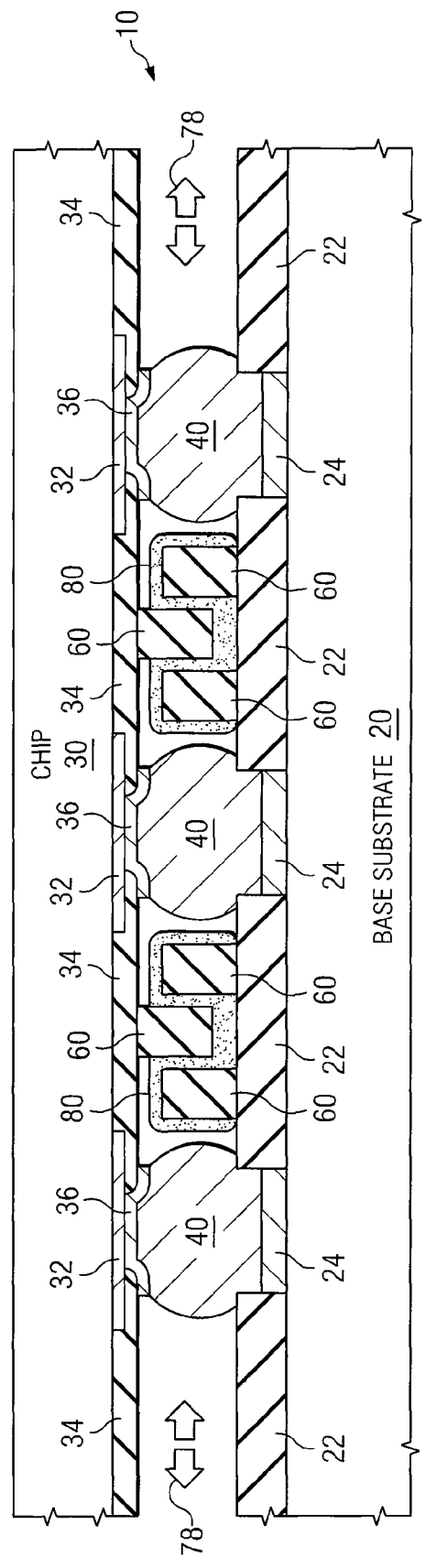
FIG. 4C is a diagram illustrating the adhesive applied to hedges disposed as pairs on the surface of the base substrate of FIG. 2B, in accordance with one embodiment of the present invention.

FIG. 4C is a diagram illustrating adhesive 80 applied to hedges 60 disposed as pairs on the surface of base substrate 20 of FIG. 2B, in accordance with one embodiment of the present invention. In the illustrated embodiment, pairs of hedges 60 are disposed on base substrate 20, such that each of the hedges 60 on chip 30 are positioned between the pairs to improve reliability in the event of movement caused by, for example, thermal expansion or contraction. For example, pairs of hedges 60 disposed on base substrate 20 may restrict movement lateral movement between chip 30 and base substrate 20 in both lateral directions (e.g., side-to-side movement as indicated by reference number 78). Moreover, pairs of hedges 60 may pick up more volume of adhesive 80 (if used) in an adhesive dip, thereby facilitating improved bonding to hedges 60 on chip 30.

Figure 5:
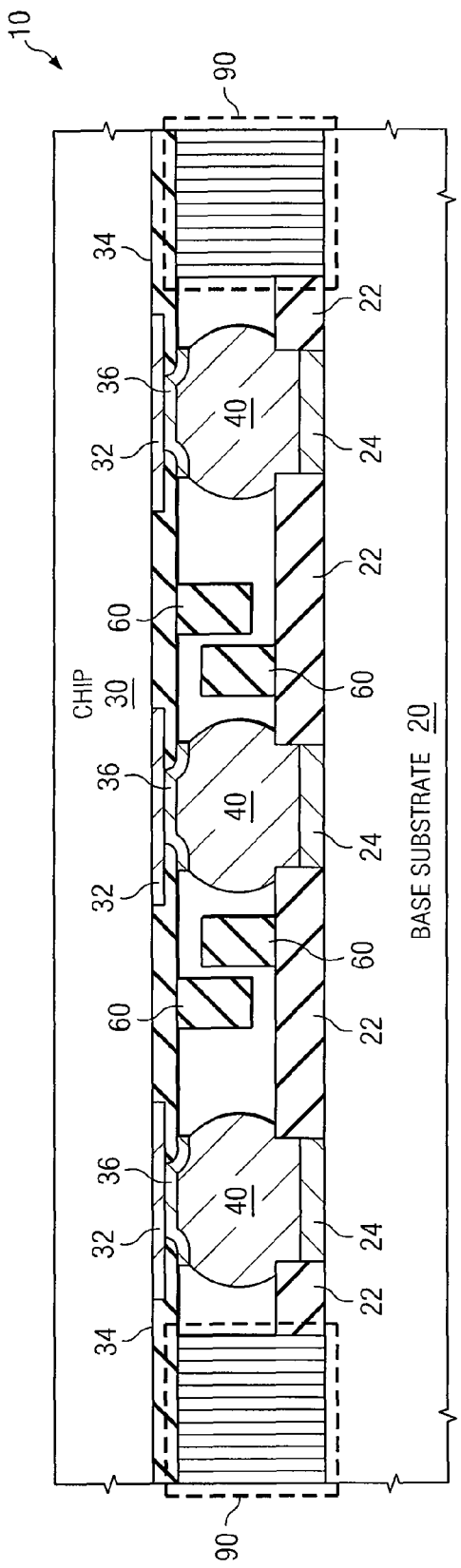
FIG. 5 is a diagram illustrating the chip of FIG. 2A hermetically sealed with the base substrate of FIG. 2B, in accordance with one embodiment of the present invention.

FIG. 5 is a diagram illustrating chip 30 of FIG. 2A hermetically sealed with base substrate 20 of FIG. 2B, in accordance with one embodiment of the present invention. In the illustrated embodiment, assembly 10 comprises a sealant perimeter 90 between base substrate 20 and chip 30. Sealant perimeter 90 may comprise any suitable materials, for example polymers or metals, used to seal substrates together. In the embodiment, because sealant perimeter 90 forms a complete perimeter around assembly 10, perimeter 90 may provide a hermetic seal to reduce moisture exposure to solder bumps 40.

Thus, example embodiments of the present invention provide a reliable semiconductor assembly. In the event of stress induced by, for example, CTE mismatch, the hedges can prevent or restrict lateral movement and thereby reduce the impact on solder bumps. Moreover, when the hedges are bonded with adhesive, the reliability may also improve in the event of movement in the vertical direction. Hedge pairs may provide additional reliability and may facilitate improved hedge bonding between the chip and the substrate.

The example embodiments discussed above may utilize conventional bumping and coupling equipment, and therefore, reduce manufacturing costs. The example embodiments of the present invention also facilitate the standardization of substrates, regardless of their original supplier or tolerance level, which can also reduce manufacturing costs. In addition, it should be noted that the example embodiments apply to many varieties of assemblies, such as chip on chip, chip on package, electro-optic component on chip, and micro-electro-mechanical systems (MEMS) on chip.

Figure 6:
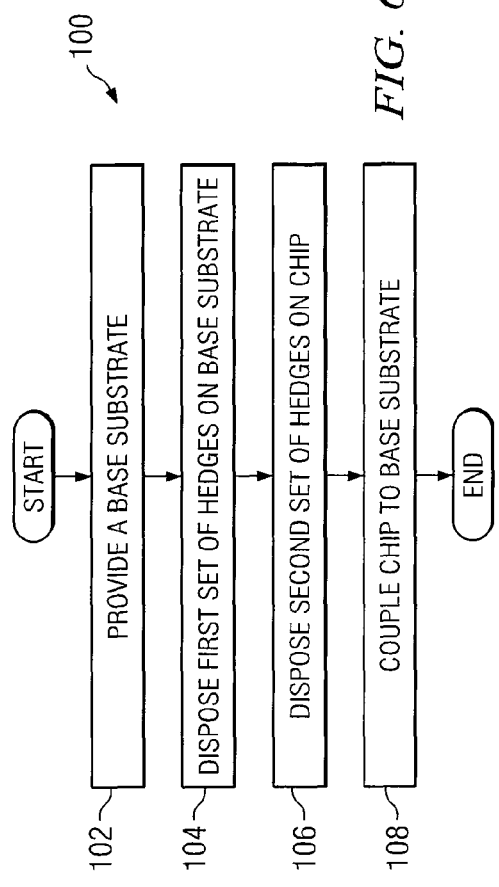
FIG. 6 is a flow diagram illustrating an example method for providing a semiconductor assembly, in accordance with one embodiment of the present invention.

FIG. 6 is a flow diagram illustrating an example method 100 for providing a semiconductor assembly, in accordance with one embodiment of the present invention. The example method 100 begins at step 102 where a base substrate is provided. For example, the base substrate may comprise a plastic surface mount for a chip (also referred to as a package). As another example, the base substrate may comprise a second semiconductor chip.

At step 104, a first set of one or more non-conductive hedges is disposed on and protrudes from a first surface of the base substrate. At step 106, a second set of one or more non-conductive hedges is disposed on and protrudes from a second surface of a chip. For example, the first and second set of hedges may comprise a deformable material such as a photo-epoxy or polysiloxane based material.

At step 108, the chip is coupled to and spaced apart from the base substrate. According to one embodiment, the second surface of the chip faces the first surface of the base substrate. For example, to couple the chip to the substrate, solder bumps are applied to the surface of the chip. In the example, the chip and the applied solder bumps are aligned over the base substrate, such that each solder bump at least partially fills a bump pad on the base substrate, and such that the chip is spaced apart from the base substrate.

Thus, the sets of one or more hedges are configured and positioned on the chip and on the base substrate to engage each other to restrict movement, such as upon thermal expansion or contraction. This helps to reduce the amount of stress at the solder bumps and improves the reliability of the solder bumps and assembly.

It should be understood that some of the steps illustrated in FIG. 6 may be combined, modified or deleted where appropriate, and additional steps may also be added to the flow diagram. Additionally, as indicated above, steps may be performed in any suitable order without departing from the scope of the invention.

Although the present invention has been described in detail with reference to particular embodiments, it should be understood that various other changes, substitutions, and alterations may be made hereto without departing from the spirit and scope of the present invention. For example, although the present invention has been described with reference to a number of components included within assembly 10, other and different components may be utilized to accommodate particular needs. The present invention contemplates great flexibility in the arrangement of these elements as well as their internal components.

Numerous other changes, substitutions, variations, alterations and modifications may be ascertained by those skilled in the art and it is intended that the present invention encompass all such changes, substitutions, variations, alterations and modifications as falling within the spirit and scope of the appended claims. Moreover, the present invention is not intended to be limited in any way by any statement in the specification that is not otherwise reflected in the claims.

What is claimed is:

1. A semiconductor assembly, comprising:
   a substrate;
   a first set of one or more flexible, non-conductive hedges disposed on and protruding from a first surface of the substrate;
   a chip coupled to and spaced apart from the substrate, the chip having a second surface facing the first surface of the substrate, wherein the chip is coupled to the substrate by a plurality of solder bumps;
   a second set of one or more flexible, non-conductive hedges disposed on and protruding from the second surface of the chip;
   at least one hedge of the first set of one or more hedges and at least one hedge of the second set of one or more hedges being positioned between two adjacent solder bumps;
   the first set of one or more hedges being configured and positioned to engage the second set of one or more hedges to restrict movement of the substrate with respect to the chip;
   the second set of one or more hedges being configured and positioned to engage the first set of one or more hedges to restrict movement of the chip with respect to the substrate; and
   an adhesive applied to at least one of the sets of one or more hedges, the adhesive bonding the first and second sets of one or more hedges together.

2. The assembly of claim 1, wherein the first set of one or more hedges and the second set of one or more hedges have a rectangular shape.

3. The assembly of claim 1, wherein:
   the substrate has a first coefficient of thermal expansion;
   the chip has a second coefficient of thermal expansion; and
   the first coefficient of thermal expansion is different from the second coefficient of thermal expansion.

4. The assembly of claim 1, wherein the substrate comprises a plastic surface mount.

5. The assembly of claim 1, wherein the first set of one or more hedges and the second set of one or more hedges are formed using photolithography.

6. The assembly of claim 1, wherein at least one of the second set of one or more hedges is positioned between at least two of the first set of one or more hedges so as to restrict lateral movement between the chip and the substrate in both lateral directions.

7. The assembly of claim 1, wherein at least one of the first set of one or more hedges is positioned between at least two of the second set of one or more hedges so as to restrict lateral movement between the chip and the substrate in both lateral directions.

8. The assembly of claim 1, wherein at least a portion of the substrate is hermetically sealed to the chip.

9. The assembly of claim 1, wherein the first set of one or more hedges is substantially perpendicular to the substrate.

10. The assembly of claim 1, wherein the second set of one or more hedges is substantially perpendicular to the chip.

11. The assembly of claim 1, wherein the substrate comprises a second chip.

12. A method for providing a semiconductor assembly, comprising:
    providing a substrate;
    disposing a first set of one or more flexible, non-conductive hedges on and protruding from a first surface of the substrate;
    coupling a chip to and spaced apart from the substrate using a plurality of solder bumps, the chip having a second surface facing the first surface of the substrate;
    disposing a second set of one or more flexible, non-conductive hedges on and protruding from the second surface of the chip;
    at least one hedge of the first set of one or more hedges and at least one hedge of the second set of one or more hedges being positioned between two adjacent solder bumps;
    the first set of one or more hedges being configured and positioned to engage the second set of one or more hedges to restrict movement of the substrate with respect to the chip;
    the second set of one or more hedges being configured and positioned to engage the first set of one or more hedges to restrict movement of the chip with respect to the substrate; and
    applying an adhesive to at least one of the sets of one or more hedges, the adhesive bonding the first and second sets of one or more hedges together.

13. The method of claim 12, wherein the first set of one or more hedges and the second set of one or more hedges have a rectangular shape.

14. The method of claim 12, wherein:
    the substrate has a first coefficient of thermal expansion;
    the chip has a second coefficient of thermal expansion; and
    the first coefficient of thermal expansion is different from the second coefficient of thermal expansion.

15. The method of claim 12, wherein the substrate comprises a plastic surface mount.

16. The method of claim 12, wherein the first set of one or more hedges and the second set of one or more hedges are formed using photolithography.

17. The method of claim 12, wherein at least one of the second set of one or more hedges is positioned between at least two of the first set of one or more hedges so as to restrict lateral movement between the chip and the substrate in both lateral directions.

18. The method of claim 12, wherein at least one of the first set of one or more hedges is positioned between at least two of the second set of one or more hedges so as to restrict lateral movement between the chip and the substrate in both lateral directions.

19. The method of claim 12, wherein at least a portion of the substrate is hermetically sealed to the chip.

20. The method of claim 12, wherein the first set of one or more hedges is substantially perpendicular to the substrate.

21. The method of claim 12, wherein the second set of one or more hedges is substantially perpendicular to the chip.

22. The method of claim 12, wherein the substrate comprises a second chip.

\* \* \* \* \*